(12) United States Patent
Brückmann et al.

(10) Patent No.: US 7,099,641 B2
(45) Date of Patent: Aug. 29, 2006

(54) RECEIVER CIRCUIT FOR MOBILE RADIO RECEIVERS WITH AUTOMATIC GAIN CONTROL

(75) Inventors: Dieter Brückmann, Meerbusch (DE); André Neubauer, Krefeld (DE)

(73) Assignee: Infineon Technologies AG, Munich (DE)

( * ) Notice: Subject to any disclaimer, the term of this patent is extended or adjusted under 35 U.S.C. 154(b) by 425 days.

(21) Appl. No.: 10/382,192

(22) Filed: Mar. 5, 2003

(65) Prior Publication Data
US 2003/0157910 A1 Aug. 21, 2003

Related U.S. Application Data

(63) Continuation of application No. PCT/DE01/03233, filed on Aug. 21, 2001.

(30) Foreign Application Priority Data
Sep. 5, 2000 (DE) ................ 100 43 744

(51) Int. Cl.
*H04B 1/06* (2006.01)
*H04B 7/00* (2006.01)
(52) U.S. Cl. ............... 455/232.1; 455/240.1; 455/245.2; 375/345
(58) Field of Classification Search .. 455/122.1–253.2; 375/345
See application file for complete search history.

(56) References Cited

U.S. PATENT DOCUMENTS

| | | | |
|---|---|---|---|
| 4,355,414 A | 10/1982 | Inoue | |
| 5,483,691 A * | 1/1996 | Heck et al. | 455/234.2 |
| 5,867,063 A * | 2/1999 | Snider et al. | 330/133 |
| 5,982,821 A | 11/1999 | Kingston et al. | |
| 6,002,352 A | 12/1999 | El-Ghoroury et al. | |
| 6,005,506 A | 12/1999 | Bazarjani et al. | |
| 6,009,129 A | 12/1999 | Kenney et al. | |
| 6,088,583 A * | 7/2000 | Shimizu et al. | 455/235.1 |
| 6,107,878 A | 8/2000 | Black | |
| 6,163,685 A * | 12/2000 | Dilling et al. | 455/247.1 |
| 6,212,244 B1 * | 4/2001 | Davidovici et al. | 375/345 |
| 6,226,504 B1 * | 5/2001 | Takagi | 455/234.1 |
| 6,314,144 B1 * | 11/2001 | Moriyama et al. | 375/316 |
| 6,314,278 B1 * | 11/2001 | Zamat | 455/239.1 |
| 6,321,073 B1 * | 11/2001 | Luz et al. | 455/239.1 |

(Continued)

FOREIGN PATENT DOCUMENTS

DE 198 04 922 A1 8/1999

(Continued)

OTHER PUBLICATIONS

Wang, P. C. et al.: "A Software AGC Scheme for Integrated Communication Receivers", Aerospace and Electronics Conference 1989, NAECON 1989, IEEE, vol. 4, May 22-26, 1989, pp. 2085-2091.

(Continued)

*Primary Examiner*—Simon Nguyen
(74) *Attorney, Agent, or Firm*—Laurence A. Greenberg; Werner H. Stemer; Ralph E. Locher

(57) ABSTRACT

A receiver circuit for a mobile radio receiver has a controllable amplifier with a variable gain level, an analog-digital converter stage, a digital filter configuration for the purpose of channel selection and a signal strength estimator. The signal strength estimator is connected downstream of the filter configuration in the signal path and has the purpose of determining the signal strength in the selected user signal. The amplifier is controlled in dependence on the user-channel signal strength determined by the signal strength estimator.

16 Claims, 3 Drawing Sheets

U.S. PATENT DOCUMENTS

| | | | |
|---|---|---|---|
| 6,434,186 B1 * | 8/2002 | Dowling | 375/147 |
| 6,442,380 B1 * | 8/2002 | Mohindra | 455/234.1 |
| 6,553,084 B1 * | 4/2003 | Maru | 375/345 |
| 6,556,636 B1 | 4/2003 | Takagi | |
| 6,563,891 B1 * | 5/2003 | Eriksson et al. | 375/345 |
| 6,571,083 B1 * | 5/2003 | Powell et al. | 455/69 |
| 6,574,292 B1 * | 6/2003 | Heinonen et al. | 375/345 |
| 6,654,594 B1 * | 11/2003 | Hughes et al. | 455/245.1 |
| 6,775,336 B1 * | 8/2004 | Takaki | 375/345 |
| 2002/0136289 A1 * | 9/2002 | Shukla et al. | 375/232 |

FOREIGN PATENT DOCUMENTS

| | | |
|---|---|---|
| EP | 0 213 224 B1 | 3/1987 |
| EP | 0 706 730 B1 | 4/1996 |
| EP | 0 814 568 A1 | 12/1997 |
| EP | 0 913 934 A2 | 5/1999 |
| JP | 56-43809 | 4/1981 |
| JP | 62-53526 | 3/1987 |
| JP | 09326775 A | 12/1997 |
| JP | 11-112461 | 4/1999 |
| JP | 11-145858 | 5/1999 |
| JP | 11154988 | 6/1999 |
| JP | 11-261433 | 9/1999 |
| WO | 99/30428 | 6/1999 |
| WO | WO 00/31867 | 6/2000 |
| WO | 01/93437 A1 | 12/2001 |

OTHER PUBLICATIONS

Author not listed: "Programmable Downconverter", Intersil, 2000, pp. 3-1 to 3-60.

* cited by examiner

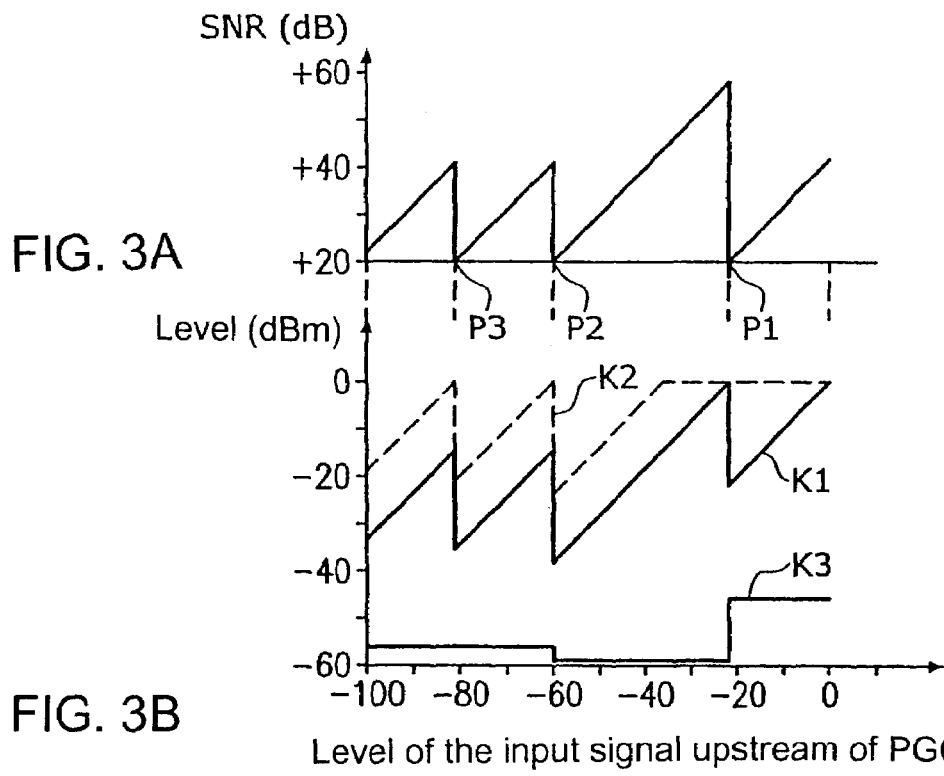
FIG. 3A
FIG. 3B
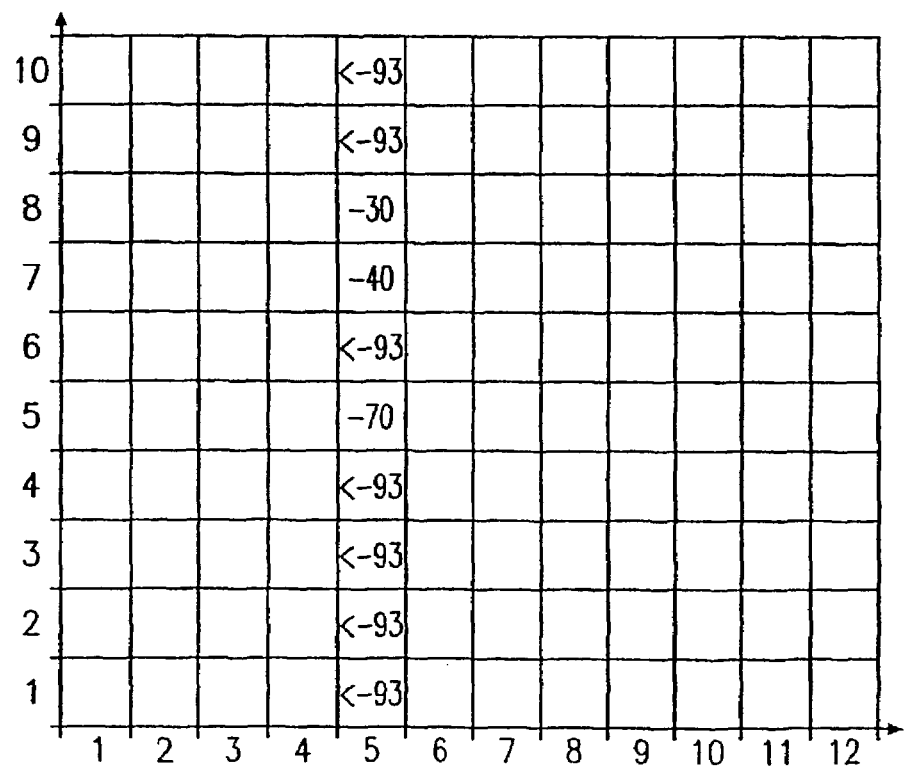
FIG. 4

RECEIVER CIRCUIT FOR MOBILE RADIO RECEIVERS WITH AUTOMATIC GAIN CONTROL

CROSS-REFERENCE TO RELATED APPLICATION

This application is a continuation of copending International Application No. PCT/DE01/03233, filed Aug. 21, 2001, which designated the United States and which was not published in English.

BACKGROUND OF THE INVENTION

Field of the Invention

The invention relates to a receiver circuit for a mobile radio receiver, in particular a cordless telephone, which is equipped with a controllable amplifier with a variable gain level. In addition, the invention relates to a method for processing a received signal in a mobile radio receiver.

As a result of the further development of mobile communications systems, new requirements are being made of the future terminals and their system components so that, inter alia, a more flexible range of services can be offered. In particular, a greater degree of flexibility, a lower level of power consumption, smaller dimensions and lower costs are required.

One possible way of fulfilling these requirements is for the analog signal processing means which are mainly used in contemporary mobile radio receivers to be largely replaced by digital signal processing means. For example, in recent years, the increase in the power of digital technology has made it possible to further process even relatively high frequency intermediate frequency signals in a digital fashion, enabling the proportion of the analog functions in the radio frequency section of the receiver to be significantly reduced. Generally, the increasing conversion of means for carrying out signal processing tasks into digital technology is leading to improved integration and flexibility of the system concept, improvement of the long-term stability and to a reduced number of tuning points when optimizing the receiver.

In this context, it is already known to dispense with a channel selection in the analog field and instead digitize the broadband intermediate frequency signal and perform the channel selection in the digital domain by way of digital filters.

However, the already mentioned system advantages of such a solution are also accompanied by disadvantages. When a broadband radio-frequency intermediate frequency signal is converted into the digital domain, a considerable degree of supplementary expenditure for the analog-digital converter is necessary. When digitizing a broadband intermediate-frequency signal, the converter must be capable of fulfilling high dynamic and bandwidth requirements.

In order to be able to fulfill the high bandwidth requirements, it has already become known to use analog-digital converters which operate according to the flash method. It is a disadvantage that that type of converter is very costly and expensive.

In order to reduce the dynamic requirements of the analog-digital converter (dynamic differences of up to 100 dB can occur in the reception signal), it has become known to implement an automatic gain control AGC in the analog section. The AGC ensures that the input signal of the analog-digital converter is always set to an optimum level. It is a disadvantage that the AGC also requires a considerable degree of implementation expenditure.

In an AGC, the signal strength estimation is carried out in the region of the analog signal processing means, i.e. in the signal path upstream of the analog-digital converter stage. A known modification of an AGC is the PGC (programmable gain control). In a PGC, the gain setting is derived from a digital control word which is output by a signal strength estimator which is arranged in the digital signal processing region.

A mobile radio converter module with the designation HSP50214B from HARRIS Semiconductor (Intersil) is known which has a PGC and which carries out channel selection in the region of the digital signal processing means (by means of digital filters). The PGC is constructed from a cascade composed of 36 individual amplifier stages, each with a gain level of 2 dB which can be individually connected into the circuit and disconnected from it. The estimation of the signal strength is carried out in the digital domain on the composite signal, i.e. before the channel selection.

A disadvantage with that module is especially the high implementation expenditure of the PGC. Further disadvantages are the likewise costly implementation of the external analog-digital converter stage and the digital filter arrangement.

SUMMARY OF THE INVENTION

It is accordingly an object of the invention to provide a receiver circuit for mobile radio receiver with automatic gain control, which overcomes the above-mentioned disadvantages of the heretofore-known devices and methods of this general type and which provides for a receiver circuit for a mobile radio receiver with channel selection in the digital signal processing region, which can be implemented more cost-effectively, in particular with respect to the gain control. In addition, a method for processing a received signal in a mobile radio receiver is to be disclosed, which method permits cost-effective forms of implementation with respect to the necessary hardware equipment.

With the foregoing and other objects in view there is provided, in accordance with the invention, a receiver circuit for a mobile radio receiver, which comprises the following elements and units, connected in the following sequence in the signal path of the device:

a controllable amplifier having a variable gain level;
an analog-digital converter stage;
a digital filter configuration for channel selection;
a signal strength estimator for determining a signal strength in a selected user channel; and
a feedback connected between said signal strength estimator and said amplifier for controlling said amplifier in dependence on a function of the signal strength of the user-channel determined by said signal strength estimator.

That is, the amplifier (PGC) is controllable as a function of the user-channel signal strength determined by the signal strength estimator.

With the above and other objects in view there is also provided, in accordance with the invention, a method for processing a received signal in a mobile radio receiver. The novel method comprises the following steps:

amplifying the received signal with a controllable amplifier having a variable gain;
digitizing the amplified signal with an analog-digital converter stage to form a digitized signal;

limiting a bandwidth of the digitized signal with a digital filter configuration for channel selection; and determining a signal strength of a selected user-channel signal with a signal strength estimator; and controlling the controllable amplifier in dependence on the signal strength of the user-channel determined by the signal strength estimator.

By virtue of the fact that an information item which relates to the signal strength in the user channel is available for the setting of a suitable gain level of the controllable amplifier, a more targeted amplification adjustment, i.e. one which is better adapted to the actual requirements, can be performed in the amplifier.

The signal strength of the broadband input signal may, for example, drop, while the signal strength of the user-channel signal remains constant, decreases only insignificantly or even increases. In these cases, the adjustment of the amplifier for the purpose of level adaptation can be omitted. If, on the other hand, as in the prior art, an information item which relates to the signal strength in the user channel is not available, the gain must be readjusted immediately whenever the composite signal strength drops because it must be assumed that the channel-selected user signal is also affected by the loss of energy.

As a result, the invention permits a much less costly way of implementing the amplifier. The circuit exhibits very good control behavior.

In accordance with an added feature of the receiver circuit according to the invention, the controllable amplifier, in particular PGC, is composed of a plurality of amplifier stages, in that the receiver circuit comprises an evaluation device to which the user-channel signal strength determined by the signal strength estimator is communicated, and in that an amplifier stage is connected into the circuit whenever the evaluation device detects that the signal-to-noise ratio in the reception signal has dropped below a predefined value. This form of level adaptation ensures that the connection of a further amplifier stage of the amplifier into the circuit is required only if it is actually required owing to an excessively low signal quality (expressed by the signal-to-noise ratio). This ensures that a minimum number of amplification switchover points occur over the entire dynamic range. This in turn permits the number of amplification stages of the amplifier to be minimized. As the implementation expenditure and the costs of the amplifier (for example PGC) are determined by the number of its stages, this permits an extremely cost-effective hardware to be implemented for the level adaptation upstream of the analog-digital conversion.

It is also necessary to ensure that the broadband signal which is present at the input of the analog-digital converter stage does not overdrive the analog-digital converter stage. For this purpose, it is necessary to evaluate the signal strength occurring at the input of the analog-digital converter. According to the invention, this protection against overdriving of the analog-digital converter stage is preferably achieved in that the receiver circuit also comprises a storage means in which signal strength values for the user channel and for adjacent channels can be stored, and in that the evaluation device can read out the signal strength values stored in the storage means. The advantage of this measure is that such storage means and the information stored in this storage means (for example power level values or signal level values of the user channel and of the adjacent channels) are already present in most digital mobile radio receivers (for example in GSM, DECT and Bluetooth receivers) for other reasons which are explained later. As a result of the fact that the evaluation device has access to the signal strength values stored in the storage means and these values can be suitably taken into account for the control of the amplifier, an additional signal strength estimator can be dispensed with upstream (in the case of an AGC) or downstream (in the case of a PGC) of the analog-digital converter stage.

The controllable amplifier preferably comprises between three and six, in particular four, amplifier stages.

A further advantageous refinement of the invention is characterized in that the analog-digital converter stage is implemented by means of a delta-sigma converter. This type of converter is characterized by a reduced implementation expenditure in comparison to the customarily used flash digital-analog converter.

Other features which are considered as characteristic for the invention are set forth in the appended claims.

Although the invention is illustrated and described herein as embodied in a receiver circuit for mobile radio receivers with automatic gain control, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A is a graph in which the signal-to-noise ratio in the user channel is plotted against the level of the input signal for the PGC;

FIG. 3B is a graph in which the levels of the composite signal, the user signal and the noise signal in the user channel downstream of the PGC are plotted against the level of the input signal for the PGC; and FIG. 4 is a table in which signal level values for the available frequency bands are given with respect to a specific time slot.

DESCRIPTION OF THE PREFERRED EMBODIMENTS

Figure 1:
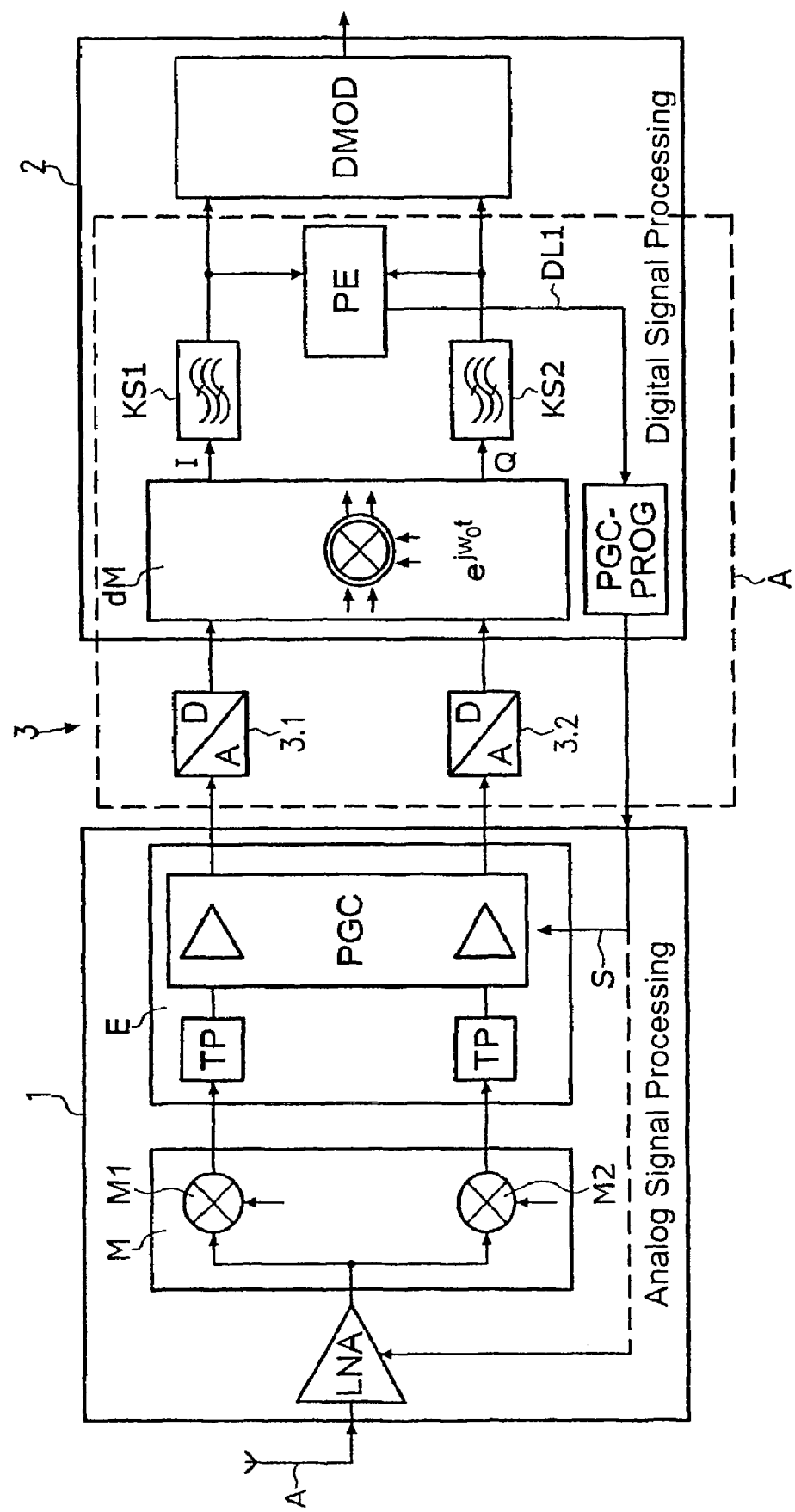
FIG. 1 is a schematic circuit diagram of a receiver circuit according to the invention.

Referring now to the figures of the drawing in detail and first, particularly, to FIG. 1 thereof, there is shown an exemplary block circuit diagram of the design of a receiver circuit according to the invention. The receiver circuit can be used in cordless digital communications systems (for example DECT, WDCT, Bluetooth, SWAP, WLAN, etc.).

The receiver circuit has a circuit part 1 which is arranged at the receive end and in which analog signal processing is carried out, a circuit part 2 which is arranged at the output end and in which the signal processing takes place in a digital fashion, and an analog-digital converter stage 3 which is connected in the signal path between the analog circuit part 1 and the digital circuit part 2.

A radio signal is received by an antenna A and fed to a low-noise input amplifier LNA. The amplification of the LNA can be carried out in an adjustable fashion so that the LNA constitutes at the same time the frontmost stage of the PGC, as illustrated in FIG. 1. The input amplifier LNA amplifies the radio-frequency antenna signal. An output signal of the amplifier LNA is fed to a radio-frequency mixer stage M. The RF mixer stage M comprises two mixers M1, M2 which downmix the amplified radio-frequency signal into an intermediate frequency range. The mixers M1 and M2 are operated in a known manner with a phase offset of 90° with an adjustable mixing frequency. At its outputs there is also in each case an analog intermediate frequency signal (in-phase branch and quadrature branch) available.

A unit E for pre-filtering and amplifying the intermediate frequency signals received by the RF mixer stage M is connected downstream of the RF mixer stage M. The unit E has, at the input end, an analog low-pass filter TP for each signal branch. The low-pass filter TP is also referred to as an anti-aliasing filter.

The outputs of the two low-pass filters TP are each fed to a PGC. The amplification of the two PGCs is variable and can be adjusted by means of a common control signal input to which a common control signal S is fed. As the control signal S is a digital control word, the setting of the amplification of the PGC is also referred to as programming.

Each PGC is composed of a plurality of amplifier stages which are connected in series and which have a constant but not necessarily identical gain. The amplifier stages are indicated by the single triangular amplifier symbol inside the PGC box. The setting of the amplification is then carried out by simply connecting an amplifier stage into the circuit or disconnecting it from the circuit as a function of an instruction by way of the control signal word S.

The outputs of the two PGCs constitute at the same time the outputs of the analog circuit part 1.

The afore-said outputs are each fed to an analog-digital converter 3.1 and 3.2, respectively. The two analog-digital converters 3.1 and 3.2 implement the analog-digital converter stage 3. A digital intermediate frequency signal whose bandwidth is limited solely by the low-pass filter TP is output at the outputs of the analog-digital converter 3.1, 3.2. This means that the digital intermediate frequency signals which are output by the analog-digital converter stage 3 can cover a plurality, in particular even all, of the available user channels.

The outputs of the analog-digital converters 3.1 and 3.2 are fed to a complex, digital intermediate frequency (IF) mixer dM. The digital IF mixer dM multiplies the digital signal values by a phase signal exp ($j\omega_0 t$) with the angular frequency $\omega_0$. In this expression, t designates the time and j the imaginary unit. The digital IF mixer dM shifts the frequency angle of the received digital signal by the generally fixed frequency $\omega_0/2\pi$.

The digital mixer dM has two outputs at which broadband digital reception signals of the I branch and of the Q branch are output.

In the signal branch downstream of the digital mixer dM, a channel selection and decimation stage KS1 and KS2, respectively, is provided in each signal branch. The two channel selection and decimation stages KS1, KS2 are identical in construction and are explained in more detail in conjunction with FIG. 2. At the output of each of the two stages KS1 and KS2, respectively, a digital signal, whose bandwidth is limited to the channel bandwidth and has a signal rate (data symbol rate) which is reduced in comparison with the sampling rate of the analog-digital converter 3.1 or 3.2, is output. The tuning of this signal to a desired user channel is carried out by means of the analog adjustable mixers M1, M2.

The two outputs of the channel selection and decimation stages KS1, KS2 are fed into a digital demodulator DMOD which demodulates the signals in a known fashion in accordance with the standard which is used as the basis for the signal transmission. The demodulation can comprise, for example, adaptive channel estimation, equalization, channel coding, etc. In a way which is not illustrated, the demodulated signal is subsequently further processed in a suitable way, i.e. it is for example de-interleaved, source-decoded, converted into an analog signal, amplified and fed to a suitable output unit (for example loudspeaker, monitor).

The outputs of the two channel selection and decimation stages KS1, KS2 are also connected to a power estimator PE. The power estimator PE performs a power estimation in the user channel on the basis of the received digital signals of the I branch and of the Q branch. The result of this power estimation (i.e. a digitally encoded value which designates the power measured in the user channel) is communicated to a PGC programming unit PGC-PROG via a data line DL1.

Instead of the power estimation, some other form of signal strength evaluation, for example the determination of a reception field strength, of a signal voltage level etc., can also be performed.

The PGC programming unit PGC-PROG controls the PGC. If the PGC is constructed from a plurality of amplifier stages which can be connected into the circuit or disconnected from it, the PGC programming unit PGC-PROG communicates to the PGC how many amplifier stages are to be activated. If the amplifier stages have different gain levels, the control signal which is output by the PGC programming unit PGC-PROG also informs the PGC which amplifier stages are to be activated or respectively deactivated.

The switching over of the PGC to a larger gain (connection of an amplifier stage into the circuit) is carried out whenever the signal-to-noise ratio in the bandwidth-limited user channel signal drops below a predefined minimum level. A threshold value which ensures that a maximum bit error rate, for example at the output of the digital demodulator DMOD, is not exceeded can be defined as a minimum signal-to-noise ratio. Controlling the switching points of the PGC as a function of the power measured in the user channel, the noise level occurring in the user channel and the predefined threshold value ensures that the PGC is switched over only if absolutely necessary—in view of a bit error rate which is no longer acceptable. As a result, this ensures that only a minimum number of switchover points occurs over the entire power range. On the other hand, this permits a PGC to be used with the lowest possible number of amplifier stages.

The signal-to-noise ratio is calculated in the PGC programming unit PGC-PROG from the power value, which is communicated via the data line DL1, and a noise level. The noise level is determined by the input noise of the receiver and the intrinsic noise of the analog circuit part 1 of the receiver, i.e. the dimensioning of the analog signal path. The noise level is dependent here on the selected gain level of the PGC. A value for the respective noise level for any possible programming of the PGC is stored in the PGC programming unit PGC-PROG. The signal-to-noise ratio which occurs in the user channel is then calculated by forming a quotient of the power value which is output by the power estimator PE with the noise level which is stored in the PGC programming unit PGC-PROG with respect to the selected programming. Another possibility is to determine the noise level in the user channel by direct measurement.

In order to explain the connection of amplifier stages into the circuit and their disconnection from it according to the invention, reference will be made to FIGS. 3A and 3B. In FIG. 3A, the logarithmic signal-to-noise ratio SNR (in dB) is plotted against the logarithmic ratio of the level of the input signal upstream of the PGC to form the maximum permissible signal level of the input signal (in dBm). The minimum permissible signal-to-noise ratio is 20 dB in this example. On the basis of a maximum signal strength (modulation limit) at 0 dBm at the input of the PGC, an amplifier stage is connected into the circuit whenever the signal-to-noise ratio is less than 20 dB, i.e. at the switchover points P1, P2, P3. A PGC comprising four amplifier stages is sufficient to carry out the method described herein.

FIG. 3B illustrates the level of the signal in the user channel downstream of the channel selection and decimation stage KS1 and KS2 (curve K1), the level of the (broadband) composite signal downstream of the PGC (curve K2) and the (gain-dependent) noise level (curve K3) in the user channel with respect to the level of the input signal upstream of the PGC (in each case in dBm), the two diagrams in FIGS. 3A and 3B having a common x axis. It becomes apparent that, whenever an amplifier stage is connected into the circuit, there is a sudden increase in the user signal level (curve K1). The opposite applies when an amplifier stage is deactivated when the level of the input signal is rising.

The curve K3 shows that the noise level in the user channel does not necessarily decrease when an amplifier stage is switched off. Since an amplifier stage also amplifies the noise of the functional blocks which are upstream of it in the signal path, when an amplifier stage is switched off, a reduction in the overall noise is to be expected as a matter of principle. At the point P3 this effect is however not significant as there (in the specific example illustrated) the amplification in the frontmost amplifier stage is changed. At the point P2, a reduction in noise can be detected as a central amplifier stage is removed. The amplifier setting at the point P1 is carried out (in the specific example) by changing the gain of a switch capacitor arrangement which forms the rearmost amplifier stage. This amplifier stage has significantly higher intrinsic noise at a low amplifier setting so that the resulting overall noise in the reception path is (even) increased.

When the PGC switches over, it is necessary to ensure that the magnitude of the gain which is connected into the circuit (in the case of a falling input signal level) has to be selected in such a way that the broadband composite signal downstream of the PGC does not bring about overdriving of the analog-digital converters 3.1 and 3.2. As the composite signal downstream of the PGC is composed of the user signal and possible (under certain circumstances larger) signals in adjacent channels, in order to reliably avoid overdriving at the input of the analog-digital converters 3.1 and 3.2, it is not sufficient to evaluate solely the power in the user signal (according to the information which is output by the power estimator PE).

One possible way of preventing overdriving of the analog-to-digital converters 3.1, 3.2 is to obtain the signal power levels from adjacent channels of a channel list. In order to explain this possibility, reference will be made to FIGS. 2 and 4.

Figure 2:
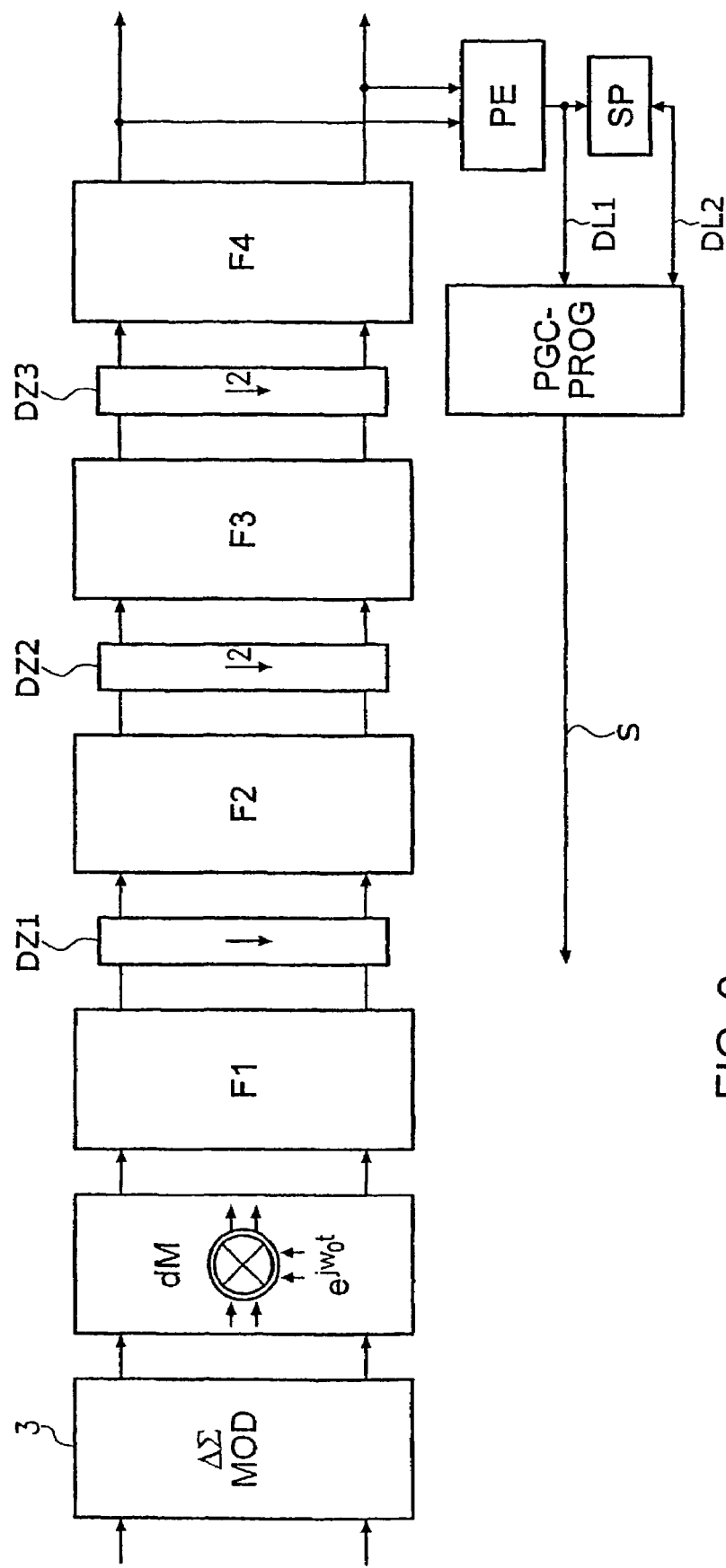
FIG. 2 is a schematic block diagram of the detail A of FIG. 1 in more detail.

FIG. 2 illustrates in more detail the detail A, outlined by a dashed line, of the receiver circuit illustrated in FIG. 1. The digital circuit part 2 has a memory SP whose input is connected to the output of the power estimator PE. An output of the memory SP is connected to the PGC programming unit PGC-PROG via a data line DL2.

Using the adjustable mixer stage M, a so-called RSSI scan is carried out at regular time intervals. The signal strength (or power) in all the available channels is determined during which RSSI scan, and entered into a list which is administered by the memory SP. An example of such a channel list is represented in FIG. 4. The example is based on an FDMA/TDMA multiple access system with ten available frequency bands (channels) and twelve time slots. In the example illustrated, a user signal in the frequency band 5 is to be received within the time slot 5. In the channel list, the signal strength values of all the available channels which have been determined by the power estimator PE during the RSSI scan are entered in the unit dBm. Channels with signal strengths less than, for example, 96 dBm are characterized in the list as free channels. Accordingly, channels 1 to 4, 6, 9 and 10 are free. Channels in which relatively large signals are measured (channels 5, 7, 8) are marked as seized.

The channel list is usually used only for finding out which channels are free, and thus available for a possible handover. In the inventive example illustrated, the information contained in the channel list is also used to prevent overdriving of the input of the analog-digital converter stage 3.

For this purpose, the PGC programming unit PGC-PROG reads out the signal strength values entered in the channel list for the time slot 5 and determines the highest signal value, in the present case 30 dBm in channel 8, whenever the gain in the PGC is to be increased owing to an excessively low signal-to-noise ratio. The gain of the PGC is then set by means of the control signal S in such a way that overdriving does not occur at the input of the analog-to-digital converter stage 3 even taking into account the maximum interference signal (channel 8). In particular, of those amplifier stages which would bring about no overdriving of the analog-to-digital converters 3.1 and 3.2 when connected into the circuit, that amplifier stage which has the maximum gain can be selected and connected into the circuit.

If adjacent inference signals (channels 7 and 8) with a larger signal strength than the user signal (channel 5) were not taken into account in the setting of the PGC, it would be possible for overdriving of the analog-digital converters 3.1, 3.2 to occur, in particular when there is a weak reception signal in the user channel.

An amplifier stage can also be switched off by reference to the signal strength values stored in the channel list, specifically if a signal level value which indicates that the analog-digital converter stage is overdriven, i.e. assumes a maximum value, appears in the list. If an additional signal level estimator is provided at the input (for an AGC) or at the output (for a PGC) of the analog-digital converter stage 3, this can of course also be used to initiate switching off of an amplifier stage.

FIG. 2 illustrates in more detail the analog-digital converter stage 3 in conjunction with the low-pass filters TP from FIG. 1. The analog-digital conversion is carried out by means of a delta-sigma modulator MOD of the order L and the channel filtering is carried out by means of a cascade composed of three decimation stages DZ1, DZ2, DZ3 and four filter stages F1, F2, F3, F4. The filter stages F1, F2, F3, F4 and the decimation stages DZ1, DZ2, DZ3 are arranged alternately so that a reduction in the sampling rate, for example by the factor 2, takes place from each filter stage to the next.

The filter stage F1 which is arranged at the input end in the signal path can be implemented by means of what is referred to as a $sinc^k$ filter of the L+1-th order. The two following filter stages F2 and F3 are implemented by minimum-phase bridge wave filters or wave digital filters. For example, the second filter stage F2 can be a bi-reciprocal wave digital filter, and the third filter stage F3 can be a bridge wave digital filter.

The output-end filter stage F4 can be implemented in the form of a simple damping filter (equalizer filter). This filter F4 is used to compensate group delay distortions which arise due to the recursive filters connected upstream.

In comparison to linear-phase FIR filters, the minimum-phase bridge wave or wave digital filters F2 and F3 are characterized by the fact that they have a minimum group delay. Moreover, the implementation expenditure on these filters F2 and F3 is significantly lower than that of FIR filters. The filter concept illustrated thus has significant advantages over a filter cascade which uses FIR filters.

In comparison to a flash analog-to-digital converter with FIR filter cascade connected downstream, the arrangement illustrated in FIG. 2 (delta-sigma modulator MOD, F1, DZ1, F2, DZ2, F3, DZ3, F4) also has a reduced implementation expenditure in the region of the analog signal processing means (i.e. at the delta-sigma modulator MOD).

In addition, it is to be noted that the PGC programming unit PGC-PROG can also be used in an optimum way to set the gain of the low-noise input amplifier LNA. In this case, when an amplification stage of the PGC is selected, the selected gain of the low-noise input amplifier LNA is also taken into account. A data control line which runs from the PGC programming unit PGC PROG to the low-noise input amplifier is designated by DL3 in FIG. 1.

We claim:

1. A receiver circuit for a mobile radio receiver, comprising:
   a controllable amplifier having a variable gain level;
   an analog-digital converter stage connected downstream of said controllable amplifier in a signal path through the receiver circuit;
   a digital filter configuration for channel selection connected downstream of said converter stage, said digital filter configuration for channel selection being a cascade filter composed of a plurality of filter stages including an input-end filter stage, intermediate filter stages, and an output-end filter stage, said intermediate filter stages and said output-end filter stage being minimum-phase filter stages;
   a signal strength estimator for determining a signal strength in a selected user channel; and
   a feedback connected between said signal strength estimator and said amplifier for controlling said amplifier in dependence on a function of the signal strength of the user-channel determined by said signal strength estimator.

2. The receiver circuit according to claim 1, wherein said minimum-phase filter stages are selected from the group consisting of wave digital filters and bridge wave digital filters.

3. A receiver circuit for a mobile radio receiver, comprising:
   a controllable amplifier having a variable gain level;
   an analog-digital converter stage connected downstream of said controllable amplifier in a signal path through the receiver circuit;
   a digital filter configuration for channel selection connected downstream of said converter stage, said digital filter configuration for channel selection being a cascade filter composed of a plurality of filter stages including an input-end filter stage and intermediate filter stages, said intermediate filter stages being minimum-phase filter stages;
   a signal strength estimator for determining a signal strength in a selected user channel; and
   a feedback connected between said signal strength estimator and said amplifier for controlling said amplifier in dependence on a function of the signal strength of the user-channel determined by said signal strength estimator.

4. The receiver circuit according to claim 3, wherein: said controllable amplifier comprises a plurality of amplifier stages; and an evaluation device is connected to receive a signal representing the user-channel signal strength determined by said signal strength estimator; and a respective said amplifier stage is connected into the circuit whenever said evaluation device detects that a signal-to-noise ratio in the user signal has dropped below a predefined value.

5. The receiver circuit according to claim 4, wherein the predefined value of the signal-to-noise ratio is approximately 20 db.

6. The receiver circuit according to claim 4, which further comprises: a memory device connected to said signal strength estimator for storing signal strength values for the user channel and for adjacent channels; and said
   evaluation device is connected to read out the signal strength values stored in said memory device.

7. The receiver circuit according to claim 6, wherein: at least some of said amplifier stages of said controllable amplifier have different gain levels; and
   respective said amplifier stages are selected for connection into the circuit in dependence on the signal strength values read out from said memory device.

8. The receiver circuit according to claim 3, wherein said controllable amplifier comprises between 3 and 6 amplifier stages.

9. The receiver circuit according to claim 3, wherein said controllable amplifier comprises 4 amplifier stages.

10. The receiver circuit according to claim 3, wherein said analog-digital converter stage is a delta-sigma converter.

11. The receiver circuit according to claim 3, wherein said minimum-phase filter stages are selected from the group consisting of wave digital filters and bridge wave digital filters.

12. The receiver circuit according to claim 3, which comprises a digital IF mixer stage connected in the signal path between said analog-digital converter stage and said digital filter configuration.

13. A method for processing a received signal in a mobile radio receiver; which comprises the following steps:
   amplifying the received signal with a controllable amplifier having a variable gain;
   digitizing the amplified signal with an analog-digital converter stage to form a digitized signal;
   limiting a bandwidth of the digitized signal with a digital filter configuration for channel selection, the digital filter configuration for channel selection being a cascade filter composed of a plurality of filter stages including an input-end filter stage, intermediate filter stages, and an output-end filter stage, the intermediate filter stages and the output-end filter stage being minimum-phase filter stages;
   determining a signal strength of a selected user-channel signal with a signal strength estimator; and
   controlling the controllable amplifier in dependence on the signal strength of the user-channel determined by the signal strength estimator.

14. A method for processing a received signal in a mobile radio receiver, which comprises the following steps:

amplifying the received signal with a controllable amplifier having a variable gain;
digitizing the amplified signal with an analog-digital converter stage to form a digitized signal;
limiting a bandwidth of the digi&ized signal with a digital filter configuration for channel selection, the digital filter configuration for channel selection being a cascade filter composed of a plurality of filter stages including an input-end filter stage and intermediate filter stages, the intermediate filter stages being minimum-phase filter stages; determining a signal strength of a selected user-channel signal with a signal strength estimator; and
controlling the controllable amplifier in dependence on the signal strength of the .user-channel detetmined by the signal strength estimator.

15. The method according to claim 14, which comprises: implementing changes in a gain level only with incremental changes; and changing from one amplification stage into an amplification stage with a higher gain level if a signal-to-noise ratio in the user-channel signal drops below a pre-defined value.

16. The method according to claim 15, which comprises: storing signal strength values for the user channel and for adjacent channels in a memory device; and when a change in the gain level is requested, reading out stored signal strength values from the memory device with an evaluation device and selecting a suitable stage level of the gain taking into account the read-out signal strength values.

* * * * *